(12) United States Patent
Yoshizaki et al.

(10) Patent No.: US 8,524,379 B2
(45) Date of Patent: Sep. 3, 2013

(54) ORGANIC ELECTROLUMINESCENCE DEVICE AND DISPLAY UNIT

(75) Inventors: Makoto Yoshizaki, Kanagawa (JP); Hirokazu Yamada, Aichi (JP)

(73) Assignee: Sony Corporation, Tokyo (JP)

( * ) Notice: Subject to any disclaimer, the term of this patent is extended or adjusted under 35 U.S.C. 154(b) by 413 days.

(21) Appl. No.: 12/688,052

(22) Filed: Jan. 15, 2010

(65) Prior Publication Data

US 2010/0181904 A1   Jul. 22, 2010

(30) Foreign Application Priority Data

Jan. 22, 2009 (JP) ................................ 2009-012180
Feb. 25, 2009 (JP) ................................ 2009-042084

(51) Int. Cl.
*H01L 51/54* (2006.01)

(52) U.S. Cl.
USPC ............ 428/690; 428/917; 313/504; 313/506

(58) Field of Classification Search
None
See application file for complete search history.

(56) References Cited

U.S. PATENT DOCUMENTS

| | | | | |
|---|---|---|---|---|
| 6,963,081 B2* | 11/2005 | Gupta et al. | ...................... | 257/40 |
| 7,276,297 B2* | 10/2007 | Lee et al. | ...................... | 428/690 |
| 7,298,083 B2* | 11/2007 | Park et al. | ...................... | 313/505 |
| 2002/0117962 A1* | 8/2002 | Beierlein et al. | ............... | 313/504 |
| 2003/0168973 A1* | 9/2003 | Lee et al. | ...................... | 313/506 |
| 2004/0113547 A1* | 6/2004 | Son et al. | ...................... | 313/504 |
| 2006/0049747 A1* | 3/2006 | Matsuda et al. | ............... | 313/504 |
| 2007/0257605 A1* | 11/2007 | Son et al. | ...................... | 313/504 |

FOREIGN PATENT DOCUMENTS

| | | |
|---|---|---|
| JP | 2003-077681 | 3/2003 |
| JP | 2003-234193 | 8/2003 |
| JP | 2006-079836 | 3/2006 |
| JP | 2007-179913 | 7/2007 |

OTHER PUBLICATIONS

Japanese Office Action dated Aug. 7, 2012, issued in connection with counterpart Japanese Patent Application No. 2009-042084.

* cited by examiner

*Primary Examiner* — Dawn L. Garrett
(74) *Attorney, Agent, or Firm* — Dentons US LLP

(57) ABSTRACT

An organic electroluminescence device capable of realizing both high light emitting efficiency and high reliability with an inexpensive structure is provided. The organic electroluminescence device includes an organic layer including a light emitting layer between an anode and a cathode. The anode has a laminated structure including a first layer composed of aluminum (Al) or an alloy containing aluminum as a main component and a second layer that is provided between the first layer and the organic layer and is composed of an alloy containing aluminum as a main component, and a resistance of the first layer is lower than a resistance of the second layer.

16 Claims, 12 Drawing Sheets

| | FIRST ANODE LAYER (LOWER LAYER) | | PROTECTIVE LAYER (MIDDLE LAYER) | | SECOND ANODE LAYER (UPPER LAYER) | | SHEET RESISTANCE (Ω/□) | REFLECTANCE (450nm) | REFLECTANCE (650nm) | LIGHT EMISSION EFFICIENCY (cd/A) | RELIABILITY |
|---|---|---|---|---|---|---|---|---|---|---|---|
| | MATERIAL | FILM THICKNESS (nm) | MATERIAL | FILM THICKNESS (nm) | MATERIAL | FILM THICKNESS (nm) | | | | | |
| EXAMPLE 1 | Al | 150 | — | — | Al-Nd | 100 | 0.2 OR LESS | 85% OR MORE | 85% OR MORE | 3.5 | RELIABILITY OF COMPARATIVE EXAMPLE 2 OR MORE |
| EXAMPLE 2 | Al | 150 | Mo | 50 | Al-Nd | 100 | 0.2 OR LESS | 85% OR MORE | 85% OR MORE | 3.5 | RELIABILITY OF COMPARATIVE EXAMPLE 2 OR MORE |
| EXAMPLE 3 | Al | 150 | Mo | 25 | Al-Nd | 100 | 0.2 OR LESS | 85% OR MORE | 85% OR MORE | 3.5 | RELIABILITY OF COMPARATIVE EXAMPLE 2 OR MORE |
| EXAMPLE 4 | Al | 150 | Mo | 50 | Al-Nd | 80 | 0.2 OR LESS | 85% OR MORE | 85% OR MORE | 3.5 | RELIABILITY OF COMPARATIVE EXAMPLE 2 OR MORE |
| COMPARATIVE EXAMPLE 1 | — | — | — | — | Al-Nd | 150 | ABOUT 0.7 | 85% OR MORE | 85% OR MORE | 3.6 | RELIABILITY OF COMPARATIVE EXAMPLE 2 OR MORE |
| COMPARATIVE EXAMPLE 2 | — | — | — | — | Al-Nd | 500 | 0.2 OR LESS | 85% OR MORE | 85% OR MORE | 3.5 | — |

FIG. 5

EXAMPLE 2 > EXAMPLE 1 = EXAMPLE 3 = EXAMPLE 4 > COMPARATIVE EXAMPLE 2

ORGANIC ELECTROLUMINESCENCE DEVICE AND DISPLAY UNIT

BACKGROUND OF THE INVENTION

1. Field of the Invention

The present invention relates to an organic electroluminescence device having an organic layer including a light emitting layer between an anode and a cathode and a display unit including such an organic electroluminescence device.

2. Description of the Related Art

An organic electroluminescence device (so-called organic EL device) in which electroluminescence (EL) of an organic material is used has a laminated structure provided with an organic layer in which an organic hole transport layer, an organic light emitting layer and the like are layered between an anode and a cathode. The organic electroluminescence device has attracted attention as a light emitting device capable of high-intensity light emitting by low voltage direct current drive.

FIG. 16 illustrates a cross sectional structure example of a top emission type organic electroluminescence device out of the foregoing organic electroluminescence device. An organic electroluminescence device 101 has a structure in which a light reflective anode 103, an organic layer 104, and a light transmissive cathode 105 are layered in this order on a drive substrate 102 having a drive circuit such as a thin film transistor (TFT). The organic layer 104 has, for example, a structure in which a hole transport layer 104A, a light emitting layer 104B, and an electron transport layer 104C are layered sequentially from the anode 103 side.

Thereby, emitted light is allowed to be extracted from the opposite side of the drive substrate 102 including the drive circuit (cathode 105 side). Thus, such a structure is advantageous to improve the aperture ratio of the light emitting section. Since the aperture ratio is improved, sufficient light emitting luminance is obtained even if the current density applied to the organic electroluminescence device is kept low. Accordingly, it leads to improvement of the life characteristics.

Thus, in the organic electroluminescence device 101, the anode 103 provided on the drive substrate 102 side is used as a reflecting electrode, and the cathode 105 is used as a transparent or semi-transparent electrode. To effectively extract emitted light from the cathode 105 side, the anode 103 should be made a material having high reflectance.

As a material composing such an anode 103, for example, it has been proposed to use silver (Ag) or an alloy containing silver as described in, for example, Japanese Unexamined Patent Application Publication No. 2003-77681 and Japanese Unexamined Patent Application Publication No. 2003-234193. Further, it has been also proposed to use an aluminum (Al) alloy containing copper (Cu), palladium (Pd), gold (Au), nickel (Ni), or platinum (Pt) as an accessory metal as described in, for example, Japanese Unexamined Patent Application Publication No. 2003-234193. Further, it has been also proposed to use an aluminum alloy containing an element with a relatively smaller work function than that of aluminum (for example, neodymium (Nd)) as an accessory metal as described in, for example, Japanese Unexamined Patent Application Publication No. 2006-79836.

In the case where aluminum (Al) alloy is used as an anode, to cover heat resistance and hillock resistance, a material containing, for example, a rear earth element (Nd), a high-melting-point metal or the like other than Al may be adopted. Examples of such a high-melting-point metal include tantalum (Ta), titanium (Ti), nickel (Ni), tungsten (W), and silicon (Si). Specially, an AlNd-based alloy containing Al and Nd, an AlTa-based alloy, an AlNi-based alloy (for example, AlCNi alloy), or an AlSi-based alloy is adoptable more suitably.

SUMMARY OF THE INVENTION

In driving a display unit including the organic electroluminescence device, there is a disadvantage that the luminance is lowered in the center of the display section. Thus, as a solution for the disadvantage, an auxiliary wiring is formed in some cases. Since such an auxiliary wiring needs a low resistance material for the foregoing reason, aluminum is more desirable than an aluminum alloy. However, to realize a simple process and low cost, it is demanded to form the auxiliary wiring in the same layer (in the same process) as that of an anode in forming the anode.

The aluminum alloy has a higher resistance than that of aluminum. Thus, it is necessary to increase the film thickness of the auxiliary wiring in order to decrease a resistance of the auxiliary wiring formed from the aluminum alloy having the same wiring width. Further, in the case where the film thickness of the auxiliary wiring is increased, the film thickness of the anode formed in the same process is also increased accordingly. However, in the case where the film thickness of the anode is increased, roughness of the anode surface deteriorates. In the result, reflectance (light emitting efficiency), reliability and the like are lowered.

That is, in the case where the aluminum alloy is used as an anode, compared to a case that aluminum simple substance is used, there are the following advantages. That is, superior heat resistance and hillock resistance are obtained. In addition, a high reflectance equal to that in the case of using the aluminum simple substance is obtained. Meanwhile, there is a disadvantage that resistance is high compared to the case of using the aluminum simple substance. Therefore, in the case where the anode and the auxiliary wiring are formed in the same process to realize a simple process and low cost, it has been difficult to realize both high light emitting efficiency and high reliability.

It is desirable to provide an organic electroluminescence device capable of realizing both high light emitting efficiency and high reliability with an inexpensive structure and a display unit including such an organic electroluminescence device.

According to an embodiment of the invention, there is provided an organic electroluminescence device including an organic layer including a light emitting layer between an anode and a cathode. Further, the anode has a laminated structure including a first layer composed of aluminum (Al) or an alloy containing aluminum as a main component and a second layer that is provided between the first layer and the organic layer and is composed of an alloy containing aluminum as a main component. A resistance of the first layer is lower than a resistance of the second layer.

According to an embodiment of the invention, there is provided a display unit including the foregoing organic electroluminescence device.

In the organic electroluminescence device and the display unit of the embodiment of the invention, in the anode having a laminated structure, the second layer composed of the alloy containing aluminum as a main component is provided on the organic layer side including the light emitting layer. Thereby, light emitted from the light emitting layer is reflected at a high reflectance. Further, the first layer that is composed of aluminum (Al) or contains aluminum as a main component and has the lower resistance than that of the second layer is provided on the side opposite to the organic layer with respect to the second layer. Thereby, for example, even if the anode is formed in the same layer as that of an auxiliary wiring, the film thickness of the whole anode is kept small, and concavity and convexity of the surface of the anode is reduced.

According to the organic electroluminescence device and the display unit of the embodiment of the invention, the anode has a laminated structure including the foregoing first layer and the foregoing second layer. Thus, light emitted from the light emitting layer is able to be reflected at a high reflectance. In addition, for example, even if the anode is formed in the same layer as that of the auxiliary wiring, concavity and convexity of the surface of the anode is able to be reduced. Therefore, both high emitting efficiency and high reliability are able to be realized with an inexpensive structure.

Other and further objects, features and advantages of the invention will appear more fully from the following description.

BRIEF DESCRIPTION OF THE DRAWINGS

FIG. 5 is a diagram illustrating characteristics results in organic electroluminescence devices according to examples and comparative examples of the invention.

DETAILED DESCRIPTION OF THE PREFERRED EMBODIMENT

An embodiment of the invention will be hereinafter described in detail with reference to the drawings. The description will be given in the following order:

1. First embodiment (example that an anode of an organic electroluminescence device has a three-layer structure)
Modified example (example that an anode of an organic electroluminescence device has a three-layer structure)
Examples
2. Module and application examples to electronic devices

1. First Embodiment

Structural example of organic electroluminescence device (example of top emission type)

Figure 1:
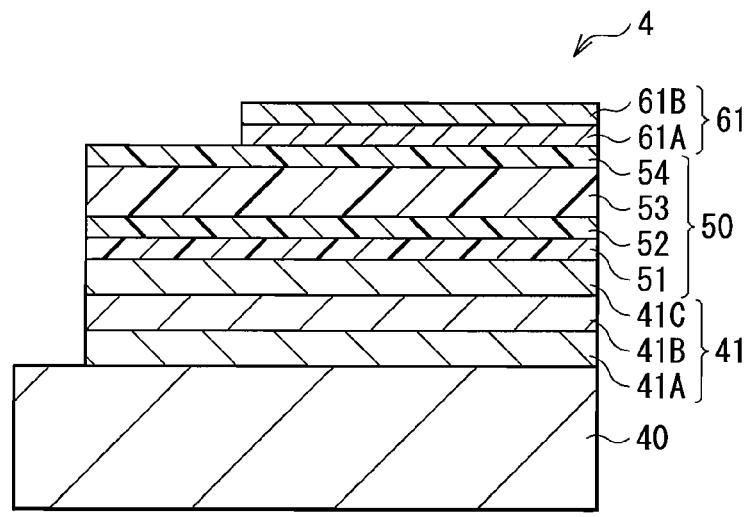
FIG. 1 is a cross sectional view illustrating a structure of an organic electroluminescence device according to an embodiment of the invention.

FIG. 1 illustrates a cross sectional structure of an organic electroluminescence device (organic electroluminescence device 4) according to an embodiment of the invention. The organic electroluminescence device (organic EL device) 4 is used, for example, for a display unit such as a color display. The organic electroluminescence device 4 includes, for example, an anode 41, an organic layer 50 including a light emitting layer 53, and a cathode 61 in this order on a substrate 40. A description will be hereinafter given of a case of a top emission type organic electroluminescence device in which light emitted from the light emitting layer 53 (hereinafter referred to as emitted light) is extracted from the cathode 61 side.

The substrate 40 is composed of, for example, a transparent substrate such as glass, a silicon substrate, a film-like flexible substrate or the like.

Anode 41

The anode 41 has a three-layer structure in which a first anode layer 41A (first layer), a protective layer 41B as a middle layer, and a second anode layer 41C (second layer) are layered sequentially from the substrate 40 side. The anode 41 is preferably formed to be able to reflect the substantial whole wavelength components of visible light (emitted light from the light emitting layer 53).

The first anode layer 41A is made of aluminum (Al) or an alloy containing aluminum as a main component. In particular, the first anode layer 41A is preferably made of aluminum. The resistance of the first anode layer 41A is lower than the resistance of the following second anode layer 41C.

The second anode layer 41C is made of an alloy containing aluminum as a main component. An accessory component of the alloy of the second anode layer 41C preferably contains at least one element having a relatively smaller work function than that of the main component of the alloy, since such an element has a high reflectance and is relatively inexpensive. Examples of such an accessory component of the alloy include a component containing at least one of neodymium (Nd) as a rare earth element, tantalum (Ta) as a high-melting-point metal, titanium (Ti), nickel (Ni), tungsten (W), and silicon (Si). Further, the content of the accessory component is preferably 10 wt % or less, since thereby a favorable reflectance is obtained, the electric conductivity becomes high, and the contact characteristics with the substrate 40 becomes high. Further, in this case, in manufacturing the organic electroluminescence device 4, the reflectance is thereby favorably and stably maintained, and high processing accuracy and chemical stability are thereby obtained. Due to such a structure, the second anode layer 41C has more superior heat stability and hillock resistance compared to the foregoing first anode layer 41A, and the second anode layer 41C has high reflectance almost equal to that of the foregoing first anode layer 41A. In other words, in the second anode layer 41C, the heat stability and the hillock resistance are higher than those of the first anode layer 41A, and the second anode layer 41C has high reflectance almost equal to that of the first anode layer 41A.

The protective layer 41B is a middle layer playing a role of blocking heat stress in film forming. Thereby it is possible that hillock is prevented from being formed, and heat resistance is improved. Such a protective layer 41B is composed of molybdenum (Mo), titanium (Ti), chromium (Cr), nickel (Ni), or an alloy containing such an element as a main component.

Figure 2:
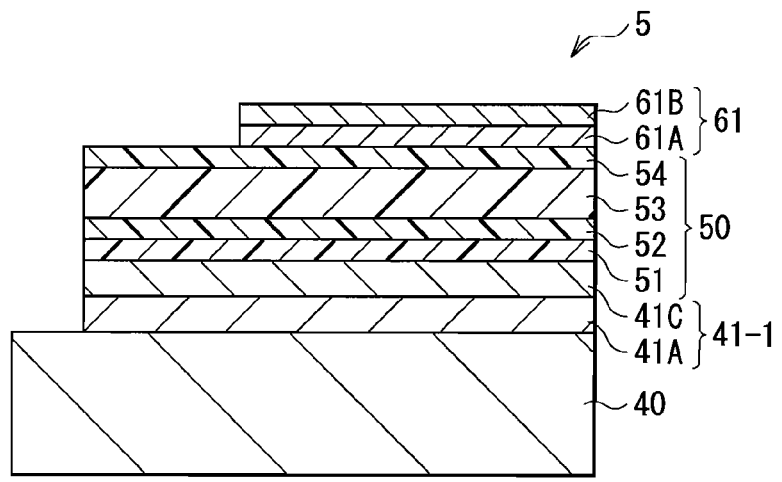
FIG. 2 is a cross sectional view illustrating a structure of an organic electroluminescence device according to a modified example of the embodiment.

For example, as an anode 41-1 in an organic electroluminescence device 5 illustrated in FIG. 2, the protective layer 41B is not necessarily provided. That is, the anode 41-1 has a two-layer structure in which the first anode layer 41A and the second anode layer 41C are layered sequentially from the substrate 40 side.

Organic Layer 50

The organic layer 50 has a laminated structure in which a hole injection layer 51, a hole transport layer 52, a light emitting layer 53, and an electron transport layer 54 are layered sequentially from the anode 41 side.

The hole injection layer 51 is intended to effectively inject hole generated in the anode 41 into the hole transport layer 52. The hole injection layer 51 is, for example, composed of 4,4',4''-tris(3-methylphenylphenylamino)triphenyl amine (m-MTDATA) or 4,4',4''-tris(2-naphthylphenylamino)triphenyl amine (2-TNATA). Specifically, the hole injection layer 51 may contain the compound shown in the following Formula 1.

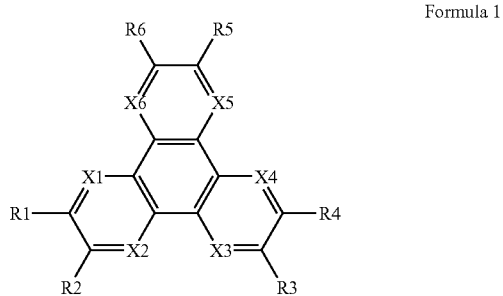

Formula 1

In the Formula 1, R1 to R6 respectively and independently represent hydrogen; halogen; a hydroxyl group; an amino group; an arylamino group; a substituent or an unsubstituted carbonyl group with the carbon number of 20 or less; a substituent or an unsubstituted carbonyl ester group with the carbon number of 20 or less; a substituent or an unsubstituted alkyl group with the carbon number of 20 or less; a substituent or an unsubstituted alkenyl group with the carbon number of 20 or less; a substituent or an unsubstituted alkoxyl group with the carbon number of 20 or less; a substituent or an unsubstituted aryl group with the carbon number of 30 or less; a substituent or an unsubstituted heterocyclic group with the carbon number of 30 or less; or a substituent group selected from the group consisting of a cyano group, a nitro group, an isocyano group, and a silyl group. Adjacent Rm (m: 1 to 6) may be bonded to each other through an annular structure. X1 to X6 respectively and independently represent a carbon atom or a nitrogen atom.

The hole transport layer 52 is intended to improve hole injection efficiency. The hole transport layer 52 is, for example, composed of 4,4'-bis(N-1-naphthyl-N-phenylamino)biphenyl (α-NPD).

The light emitting layer 53 generates light by electron-hole recombination between part of hole injected from the anode 41 side and part of electron injected from the cathode 61 side by applying an electric field. The light emitting layer 53 contains an organic material such as a styryl amine derivative, an aromatic amine derivative, a perylene derivative, a coumarin derivative, a pyran-based dye, and a triphenyl amine derivative.

The electron transport layer 54 is intended to improve electron injection efficiency into the light emitting layer 53. The electron transport layer 54 is, for example, made of 8-hydroxyquinoline aluminum ($Alq_3$).

An electron injection layer (not illustrated) for improving the electron injection efficiency may be further provided between the electron transport layer 54 and the cathode 61 in the organic layer 50. Examples of materials of the electron injection layer include an alkali metal oxide such as $Li_2O$, $Cs_2O$, LiF, and $CaF_2$; an alkali metal fluoride; an alkali earth metal oxide, and an alkali earth fluoride.

Cathode 61

The cathode 61 is one of the electrode to apply electric field to the light emitting layer 53. The cathode 61 is made of a light transmissive material (material having transmissive characteristics to emitted light from the light emitting layer 53). Thereby, emitted light from the light emitting layer 53 and emitted light reflected by the surface of the anode 41 are extracted outside through the cathode 61. In the cathode 61, a layer made of a material having small work function is formed on the light emitting layer 53 side. In the cathode 61, a first cathode layer 61A and a second cathode layer 61B are layered sequentially from the light emitting layer 53 side.

The first cathode layer 61A is made of a material that has favorable light transmission characteristics, has a small work function, and is able to effectively inject electron into the electron transport layer 54. Examples of such a material include an alkali metal oxide such as $Li_2O$, $Cs_2O$, LiF, and $CaF_2$; an alkali metal fluoride; an alkali earth metal oxide, and an alkali earth fluoride.

Further, the second cathode layer 61B is made of a material that has light transmission characteristics and has favorable electric conductivity such as a thin film MgAg electrode material and a Ca electrode material. Further, in particular, in the case where the organic electroluminescence device 4 has a cavity structure in which emitted light is resonated between the anode 41 and the cathode 61 and extracted, the second cathode layer 61B may be made of a semi-transparent reflecting material such as Mg—Ag (9:1) having a thickness of 10 nm.

The cathode 61 may have a structure in which a third cathode layer (not illustrated) as a sealing electrode for preventing electrode deterioration is layered on the second cathode layer 61B according to needs.

Examples of methods of forming each layer (the first cathode layer 61A, the second cathode layer 61B, and if necessary, the third cathode layer) of the cathode 61 include vacuum evaporation method, sputtering method, and plasma CVD method.

Example of manufacturing method of organic electroluminescence device

The foregoing organic electroluminescence device 4 may be manufactured, for example, as follows.

First, the anode 41 made of the foregoing material is formed on the substrate 40 by evaporation method, sputtering method or the like. Subsequently, the organic layer 50 is formed on the anode 41. In this case, first, the hole injection layer 51 made of the foregoing material is formed on the anode 41 by wet process such as spin coat method. Subsequently, the hole transport layer 52, the light emitting layer 53, and the electron transport layer 54 respectively made of the foregoing material are layered in this order on the hole injection layer 51 by vapor-phase method such as vacuum evaporation method. Thereby, the organic layer 50 is formed. Lastly, the first cathode layer 61A and the second cathode layer 61B are layered in this order on the electron transport layer 54 by evaporation method or the like to form the cathode 61. Thereby, the organic electroluminescence device 4 illustrated in FIG. 1 is completed.

In this case, the hole transport layer 52, the light emitting layer 53, and the electron transport layer 54 in the organic layer 50 are formed by vapor-phase method such as vacuum evaporation method. However, these layers may be formed by wet process.

Example of Configuration of Display Unit

Figure 3:
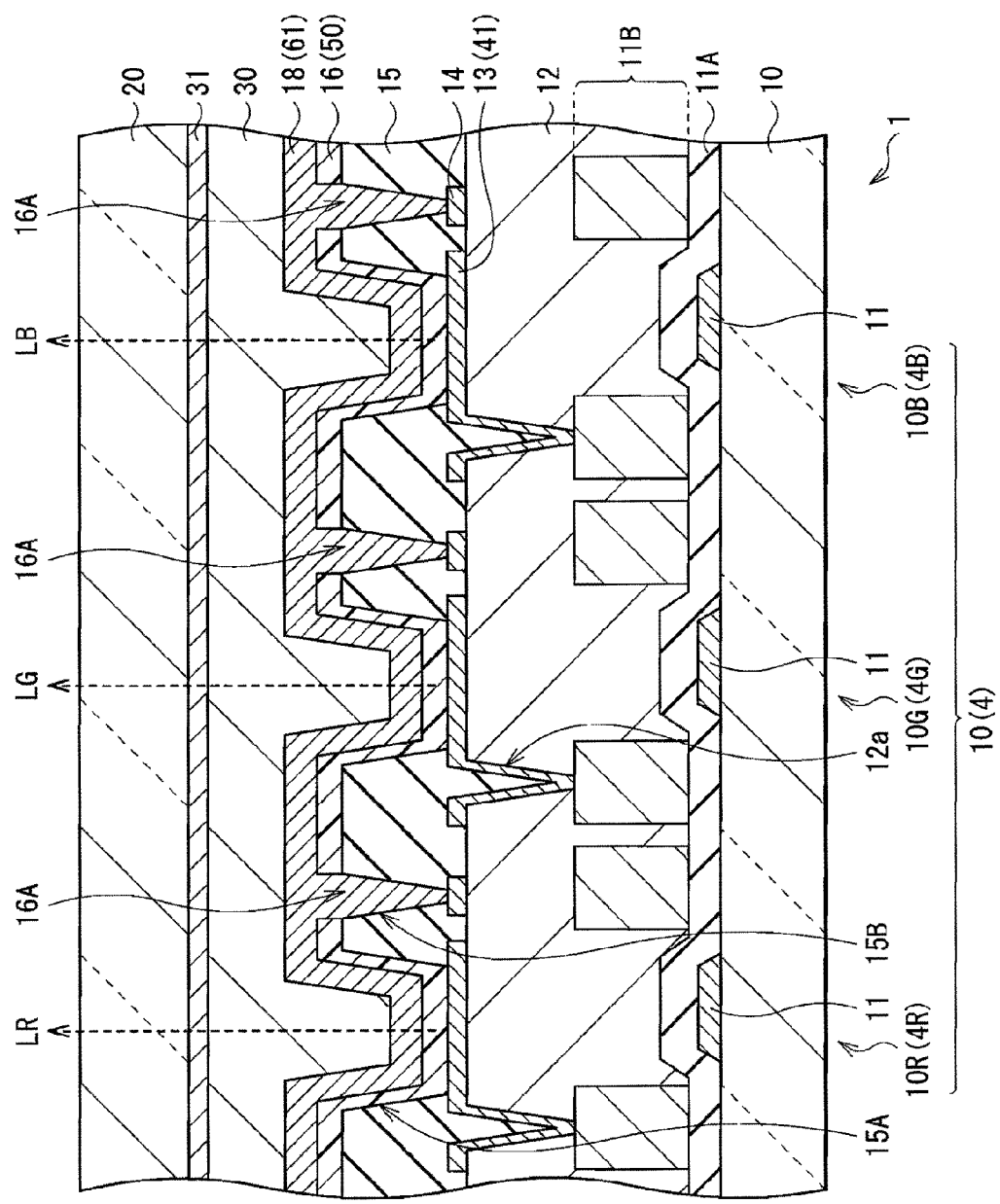
FIG. 3 is a cross sectional view illustrating a configuration example of a display unit including the organic electroluminescence device illustrated in FIG. 1.

Next, a description will be given of an example of a display unit including the foregoing organic electroluminescence device 4 (organic EL display unit) with reference to FIG. 3, FIG. 4A, and FIG. 4B. FIG. 3 illustrates a cross sectional configuration of such a display unit 1.

The display unit 1 is suitably used as a thin type organic EL display, and is an active matrix type display unit in which a plurality of pixels arranged in a state of matrix are individually driven to perform display. In the display unit 1, the foregoing organic electroluminescence device 4 (organic EL display device 10) structuring each pixel of R (Red), G (Green), and B (Blue) is sequentially provided in a state of matrix as a whole over a drive-side substrate 10 made of, for example, glass or the like. That is, an organic electroluminescence device 4R (organic EL device 10R) as an R pixel, an organic electroluminescence device 4G (organic EL device 10G) as a G pixel, and an organic electroluminescence device 4B (organic EL device 10B) as a B pixel are sequentially provided in a state of matrix as a whole. Further, over the drive-side substrate 10, a pixel drive circuit including a TFT 11 for driving the foregoing respective organic EL devices 10R, 10G, and 10B (described later in detail) and a planarizing layer 12 are formed. The foregoing organic EL devices 10R, 10G, and 10B are provided on the planarizing layer 12. The organic EL devices 10R, 10G, and 10B over the drive-side substrate 10 are sealed by a sealing-side substrate 20 with a protective film 30 and an adhesive layer 31 in between.

The TFT 11 is a drive element for driving the organic EL devices 10R, 10G, 10B by active matrix method, and may be bottom gate type or top gate type. A gate of the TFT 11 is connected to a scanning line drive circuit. A source and a drain (not illustrated) are connected to a wiring layer 11B provided with an interlayer insulating film 11A composed of, for example, silicon oxide or PSG (Phospho-Silicate Glass) in between. The wiring layer 11B is made of, for example, a single layer film composed of aluminum (Al) simple substance or an aluminum alloy, a titanium (Ti)/aluminum laminated film, or a titanium/aluminum/titanium three-layer film. The planarizing layer 12 is formed on the TFT 11, the interlayer insulating film 11A, and the wiring layer 11B.

The planarizing layer 12 is intended to planarize the surface of the drive-side substrate 10 over which the TFT 11 is formed, and to uniformly form the film thickness of each layer of the organic EL devices 10R, 10G, and 10B. The planarizing layer 12 is made of an insulating material. As such an insulating material, for example, an organic material such as a polyimide resin, an acryl resin, and a novolac resin, or an inorganic material such as silicon oxide ($SiO_2$) may be used. The planarizing layer 12 is provided with a contact hole 12a for every pixel. A first electrode 13 (anode 41) is buried into the contact hole 12a, and thereby electric connection with the foregoing wiring layer 11B is secured.

In the organic EL devices 10R, 10G, and 10B, for example, on the planarizing layer 12, the first electrode 13 (anode 41) and an auxiliary wiring 14 are arranged, on which an inter-pixel insulating film 15, an organic layer 16 (organic layer 50) including the foregoing light emitting layer 53, and a second electrode 18 (cathode 61) are layered in this order. Of the foregoing, the organic layer 16 and the second electrode 18 are provided over the all pixels as a layer common to each pixel.

The first electrode 13 is arranged for every pixel on the planarizing layer 12.

The auxiliary wiring 14 is intended to suppress voltage drop in the second electrode 18. While the auxiliary wiring 14 is electrically insulated from the first electrode 13, the auxiliary wiring 14 is electrically conducted to the second electrode 18. For example, the auxiliary wiring 14 is arranged in a region in the vicinity of the first electrode 13 on the planarizing layer 12. Meanwhile, the inter-pixel insulating film 15 and the organic layer 16 provided on the auxiliary wiring 14 are provided with a contact hole 16A penetrating through the inter-pixel insulating film 15 and the organic layer 16 down to the auxiliary wiring 14. Through the contact hole 16A, the auxiliary wiring 14 is electrically conducted to the second electrode 18. Such an auxiliary wiring 14 is arranged in an inter-pixel region between each pixel, and is arranged in an outer peripheral region surrounding the all pixel regions arranged in a state of matrix, that is, the display region.

In this embodiment, the auxiliary wiring 14 is made of the same material as that of the first electrode 13 (anode 41). Thereby, since the auxiliary wiring 14 is made of the same material as that of the first electrode 13, the auxiliary wiring 14 and the first electrode 13 are able to be patterning-formed in the same step, resulting in the reduction in the number of steps. Thus, a simple process and low cost are able to be realized to obtain a simple structure.

Figure 4A:
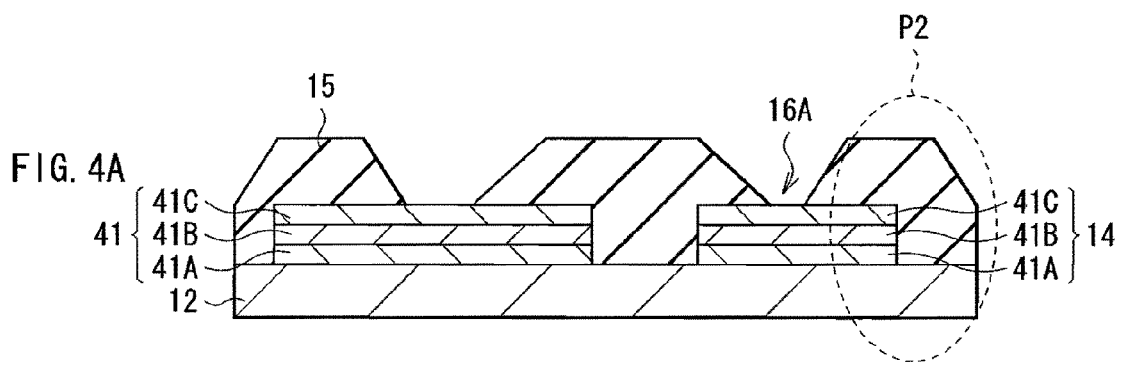
FIGS. 4A and 4B are cross sectional schematic views for explaining electric corrosion for a protective layer.
Figure 4B:
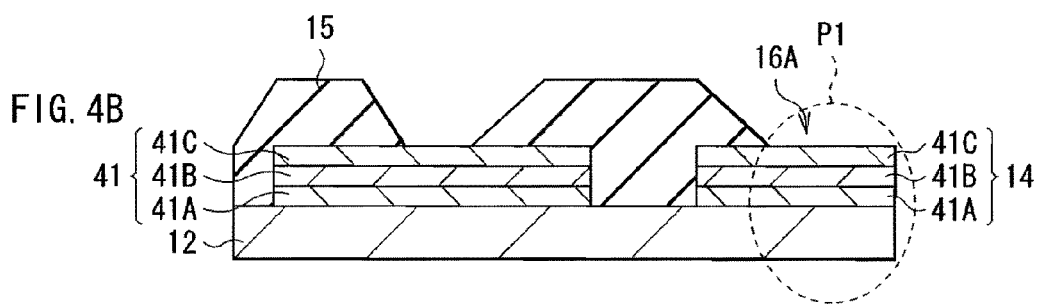

Further, in this case, for example, as illustrate in FIG. 4A, the side face of the protective layer 41B in the auxiliary wiring 14 is preferably covered with the inter-pixel insulating film 15. Thereby, in particular, in the case where molybdenum is used as the protective layer 41B, electric corrosion of the anode 41 and the auxiliary wiring 14 is avoided, and thus lowering of the reflectance in the second anode layer 41C is able to be prevented. That is, on the contrary, for example, as illustrate in FIG. 4B, in the case where the side face of the protective layer 41B in the auxiliary wiring 14 is exposed, electric corrosion is generated in the anode 41 and the auxiliary wiring 14, and thus the reflectance in the second anode layer 41C may be lowered.

The inter-pixel insulating film 15 is intended to electrically insulate the first electrode 13 from the second electrode 18 and to electrically insulate the first electrode 13 from the auxiliary wiring 14, respectively. The inter-pixel insulating film 15 is made of, for example, an insulating material such as silicon oxide ($SiO_2$) and polyimide. The inter-pixel insulating film 15 is provided with an aperture 15A correspondingly to first electrode 13, and an aperture 15B correspondingly to the auxiliary wiring 14. In the aperture 15A, the organic layer 16 and the second electrode 18 are layered in this order. In the aperture 15B, the second electrode 18 is buried. That is, a region corresponding to the aperture 15A becomes a light emitting region in the organic EL devices 10R, 10G, and 10B. The aperture 15B functions as part of the foregoing contact hole 16A.

The organic layer 16 is formed to cover the side face and the top face of the inter-pixel insulating film 15 and the top face of the first electrode 13 exposed by the aperture 15A. However, the organic layer 16 is insulated in the vicinity of a portion directly above the aperture 15B of the inter-pixel insulating film 15, and structures part of the contact hole 16A.

The protective film 30 is made of a transparent dielectric body. The protective film 30 is composed of, for example, silicon oxide ($SiO_2$), silicon nitride (SiN) or the like. The adhesive layer 31 is made of, for example, a thermosetting resin, a UV-curable resin or the like.

The sealing-side substrate 20 is intended to seal the organic EL devices 10R, 10G, and 10B together with the adhesive layer 31. The sealing-side substrate 20 is made of a material such as glass transparent to light generated in the organic EL devices 10R, 10G, and 10B (emitted light LR, LG, and LB). The sealing-side substrate 20 is provided with a red color filter, a green color filter, and a blue color filter (not illustrated) respectively corresponding to arrangement of the organic EL devices 10R, 10G, and 10B. Thereby, white light generated respectively in the organic EL devices 10R, 10G, 10B is extracted as three primary color light, outside light reflected by each layer is absorbed, and the contrast is improved. The color filter may be provided on the drive-side substrate 10. Further, black matrix may be provided between each color filter.

Action and Effect of Organic Electroluminescence Device

Subsequently, action and effect of the organic electroluminescence device 4 of this embodiment will be described.

In the organic electroluminescence device 4, when a voltage is applied to between the anode 41 and the cathode 61 and an electric field is applied to the organic layer 50, hole from the anode 41 is effectively injected from the hole injection layer 51 into the hole transport layer 52. The hole transport layer 52 effectively transports the injected hole to the light emitting layer. Meanwhile, electron from the cathode 61 is effectively transported through the electron transport layer 54 to the light emitting layer 53. The hole moved from the anode 41 side and the electron moved from the cathode 61 side are recombined in the light emitting layer 53, and thereby light is emitted. The emitted light from the light emitting layer 53 and emitted light reflected by the surface of the anode 41 are transmitted through the cathode 61 and emitted.

In this case, in the anode 41 composed of the laminated structure, the second anode layer 41C made of an alloy containing aluminum as a main component is provided on the organic layer 50 side including the light emitting layer 53. Thereby, the emitted light from the light emitting layer 53 is reflected at a high reflectance. Further, the first anode layer 41A that is composed of aluminum or contains aluminum as a main component and that has a lower resistance than that of the second anode layer 41C is provided on the side opposite to the organic layer 53 with respect to the second anode layer 41C. Thus, for example, even if the anode 41 is formed in the same layer as that of the auxiliary wiring 14, the film thickness of the whole anode 41 is kept small, and concavity and convexity (roughness) of the surface of the anode 41 is reduced.

As described above, in this embodiment, the anode 41 has the laminated structure including the foregoing first anode layer 41A and the foregoing second anode layer 41C. Thus, the emitted light from the light emitting layer 53 is able to be reflected at a high reflectance. In addition, for example, even if the anode 41 is formed in the same layer as that of the auxiliary wiring 14, concavity and convexity of the surface of the anode 41 is able to be reduced. Therefore, both high light emitting efficiency and high reliability are realized with an inexpensive structure.

Further, in the case where the protective layer 41B is provided between the first anode layer 41A and the second anode layer 41C, heat stress in film forming is blocked, hillock is prevented from being formed, and heat resistance is able to be improved.

EXAMPLES

Subsequently, a description will be given in detail of examples of the invention.

Examples 1 to 4

The organic electroluminescence devices 4 illustrated in FIG. 1 (or the organic electroluminescence devices 5 illustrated in FIG. 2) were fabricated by the following procedure. In the respective examples and after-mentioned comparative examples, as the anode 41 (or the anode 41-1), the materials and the laminated structures illustrated in FIG. 5 were used.

First, the anode 41 or the anode 41-1 was formed on the substrate 40 made of glass having dimensions of 25*25.

In Example 1, the anode 41-1 having a two-layer structure including an aluminum alloy layer containing neodymium (Nd) as a lanthanoid-based element was formed. Specifically, as illustrated in FIG. 5, the anode 41-1 was composed of an Al layer (film thickness: 150 nm) as the first anode layer 41A (lower layer) and an Al—Nd layer (film thickness: 100 nm) as the second anode layer 41C (upper layer).

Further, in Examples 2 and 3, the anode 41 having a three-layer structure including an aluminum alloy layer containing neodymium (Nd) as a lanthanoid-based element was formed. Specifically, as illustrated in FIG. 5, molybdenum (Mo) as the protective layer 41B (middle layer) was inserted between an Al layer (film thickness: 150 nm) as the first anode layer 41A (lower layer) and an Al—Nd layer (film thickness: 100 nm) as the second anode layer 41C (upper layer). The film thickness of the protective layer 41B was 50 nm in Example 2 and was 25 nm in Example 3.

Further, in Example 4, the anode 41 having a three-layer structure including an aluminum alloy layer containing neodymium (Nd) as a lanthanoid-based element was formed. Specifically, as illustrated in FIG. 5, molybdenum (Mo) as the protective layer 41B (middle layer) was inserted between an Al layer (film thickness: 150 nm) as the first anode layer 41A (lower layer) and an Al—Nd layer (film thickness: 80 nm) as the second anode layer 41C (upper layer). The film thickness of the protective layer 41B was 50 nm.

Next, with the use of the anode 41 or the anode 41-1 having the structures of Examples 1 to 4 formed as described above, a cell for an organic electroluminescence device in which portions other than a light emitting region having dimensions of 2 mm*2 mm were masked with an insulating film (not illustrated) by polyimide film forming was formed.

After that, the hole injection layer 51 was formed on the anodes 41 and 41-1 of the respective examples. At that time, as illustrated in FIG. 5, the material shown in the following Formula 2 was evaporation-deposited (evaporation rate: 0.2 to 0.4 nm/sec), and thereby the hole injection layer 51 having the film thickness of 8 nm was formed.

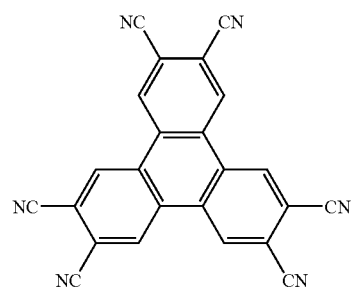

Formula 2

Next, the organic layer 50 in which the hole transport layer 52, the light emitting layer 53, and the electron transport layer 54 were layered was formed on the hole injection layer 51. After that, the cathode 61 having a two-layer structure was formed on the organic layer 50. Specifically, as the first cathode layer 61A, LiF having a film thickness of about 0.3 nm was formed by vacuum evaporation method. Next, as the second cathode layer 61B, MgAg having a film thickness of 9 nm was formed by vacuum evaporation method. Accordingly, the organic electroluminescence devices 4 and 5 illustrated in FIG. 1 and FIG. 2 were completed.

Comparative Examples 1 and 2

In Comparative examples 1 and 2, an organic electroluminescence device having an anode including an aluminum alloy single layer was fabricated instead of the anode 41 or 41-1 in a fabrication procedure similar to that of the organic electroluminescence devices 4 and 5 of the foregoing Examples 1 to 4.

Evaluation Result 1

For the organic electroluminescence devices of Examples 1 to 4 and Comparative examples 1 and 2 fabricated as above, each light emitting efficiency was measured. The measurement results thereof are also shown in FIG. 5. Each light emitting efficiency (cd/A) in FIG. 5 is a value measured in the case where the current density was 10 (mA/cm$^2$).

From the foregoing results, it was confirmed that both in the case that the anode had the two-layer structure composed of Al and the Al alloy and in the case that the anode had the three-layer structure in which Mo was sandwiched as the middle layer (protective layer) as in Examples 1 to 4, light emitting efficiency equal to that of the single layer structure composed of the Al alloy in Comparative examples 1 and 2 was obtained.

Further, it was also confirmed that since the reflectance of the anode for the light having a wavelength of 450 nm or 650 nm was a high reflectance value of 85% or more, emitted light in the light emitting layer 53 was effectively extracted outside.

Evaluation Result 2

For the organic electroluminescence devices of Examples 1 to 4 and Comparative examples 1 and 2, each relation between drive time and a relative luminance was measured. The measurement results thereof are also shown in column "Reliability" in FIG. 5, and illustrated in FIG. 6 and FIG. 7 (enlarged view of referential symbol P3 part of FIG. 6). The reliability of the organic electroluminescence devices represents a relative luminance after 600 hours lapsed in a state that the current density was 90 (mA/cm$^2$).

From the foregoing results, it was confirmed that both in the case that the anode had the two-layer structure composed of Al and the Al alloy and in the case that the anode had the three-layer structure in which Mo was sandwiched as the middle layer (protective layer) as in Examples 1 to 4, reliability exceeding the reliability of the Al alloy (film thickness: 500 nm) in Comparative example 2 was obtained.

Figure 6:
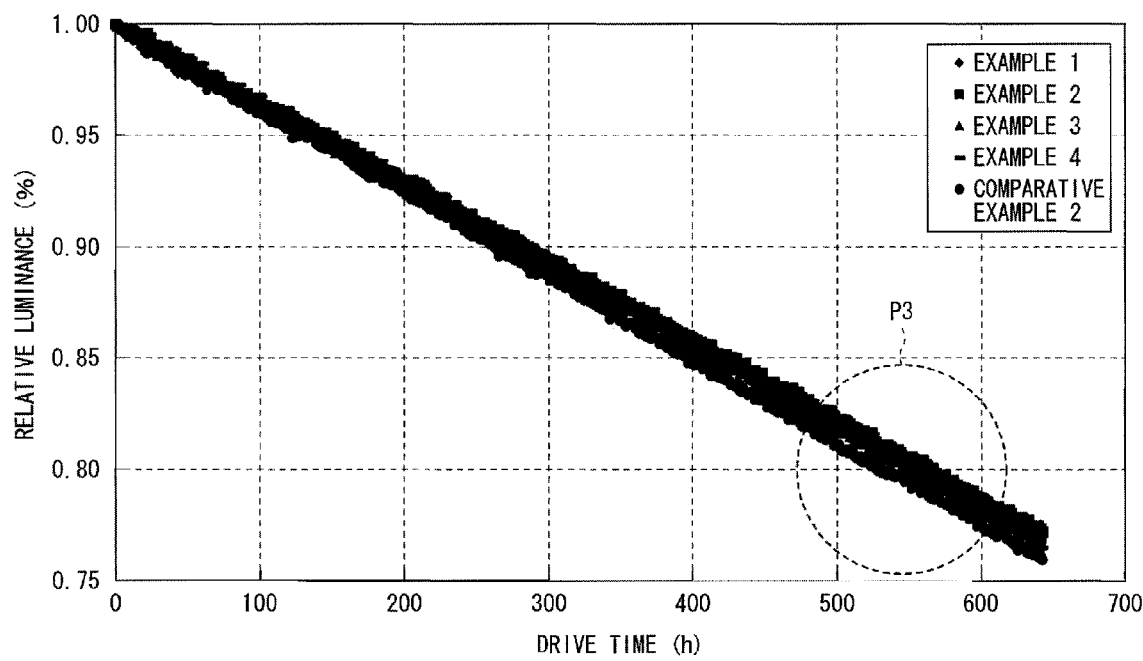
FIG. 6 is a characteristics diagram illustrating a relation between drive time and a relative luminance in the organic electroluminescence devices according to the examples and the comparative examples of the invention.
Figure 7:
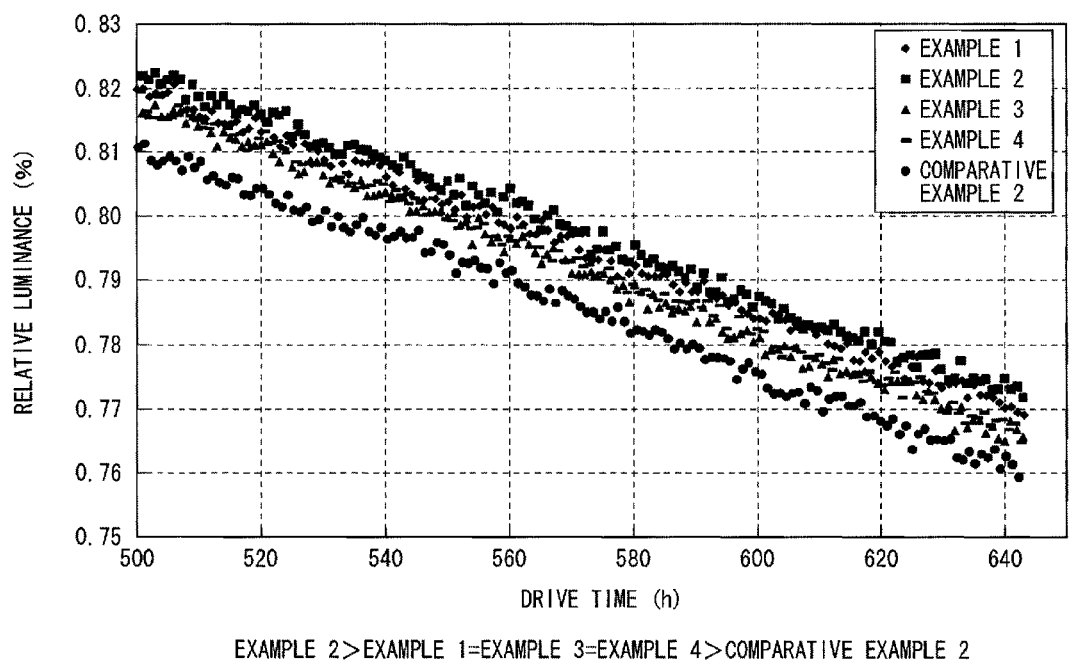
FIG. 7 is a characteristics diagram illustrating enlarged part of FIG. 6.

Further, as illustrated in FIGS. 6 and 7, it was also confirmed that reliability in Example 2 was particularly high compared to Examples 1, 3, and 4.

Evaluation Result 3

Each sheet resistance in the anodes of Examples 1 to 4 and Comparative examples 1 and 2 was measured by four terminal method. The measurement results thereof are shown in column "Sheet resistance" in FIG. 5. In all laminated structures in Examples 1 to 4, the sheet resistance was 0.2Ω/☐ or less. Thereby, it was confirmed that in the case where the anode had a laminated structure, even if the film thickness was smaller than 500 nm of the Al alloy (Comparative example 2), low resistance equal to that of the Al alloy (Comparative example 2) was obtained.

From the evaluation results 1 to 3, in the case where the anode had the laminated structure composed of the low resistance pure aluminum and the aluminum alloy that had superior heat stability and hillock resistance and that had a high reflectance, the film thickness could be decreased, low resistance was obtainable, and high light emitting efficiency was obtainable. Further, since the film thickness was decreased, concavity and convexity of the anode surface was decreased, and reliability was improved. Thus, both light emitting efficiency and high reliability were able to be realized with the use of the simple structure.

2. Module and Application Examples of Electronic Devices

A description will be given of a module of the display unit 1 including the organic electroluminescence device 4 described in the foregoing embodiment and the foregoing examples and application examples of electronic devices.

The display unit 1 is applicable to electronic devices in any field such as a television device, a digital still camera, a notebook personal computer, a portable terminal device such as a mobile phone, and a video camera. That is, the display unit 1 is applicable to an electronic device in any field for displaying a video signal inputted from outside or a video signal generated inside as an image or a video.

Module

Figure 8:
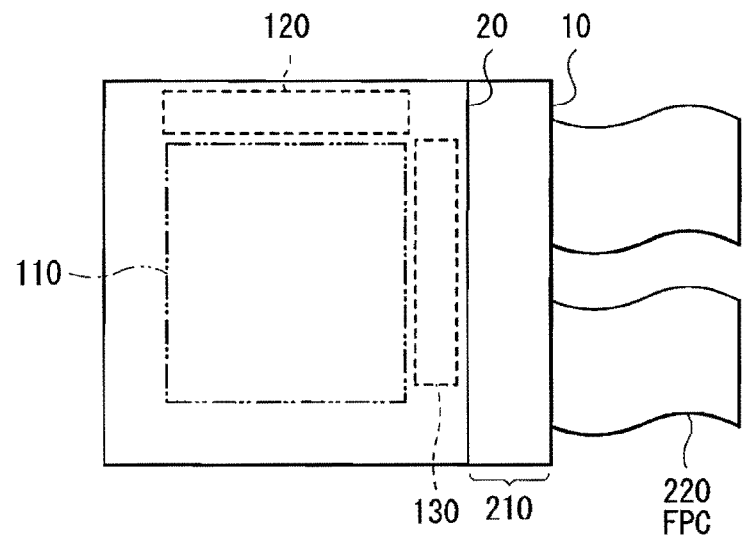
FIG. 8 is a plan view illustrating a schematic configuration of a module including the display unit of the embodiment.

The display unit 1 is incorporated in various electronic devices such as after-mentioned first to fifth application examples as a module as illustrated in FIG. 8, for example. In the module, for example, a region 210 exposed from the sealing-side substrate 20 is provided in a side of the drive-side substrate 10, and an external connection terminal (not illustrated) is formed in the exposed region 210 by extending wirings of a signal line drive circuit 120 and a scanning line drive circuit 130. The external connection terminal may be provided with a Flexible Printed Circuit (FPC) 220 for inputting and outputting a signal.

Figure 9:
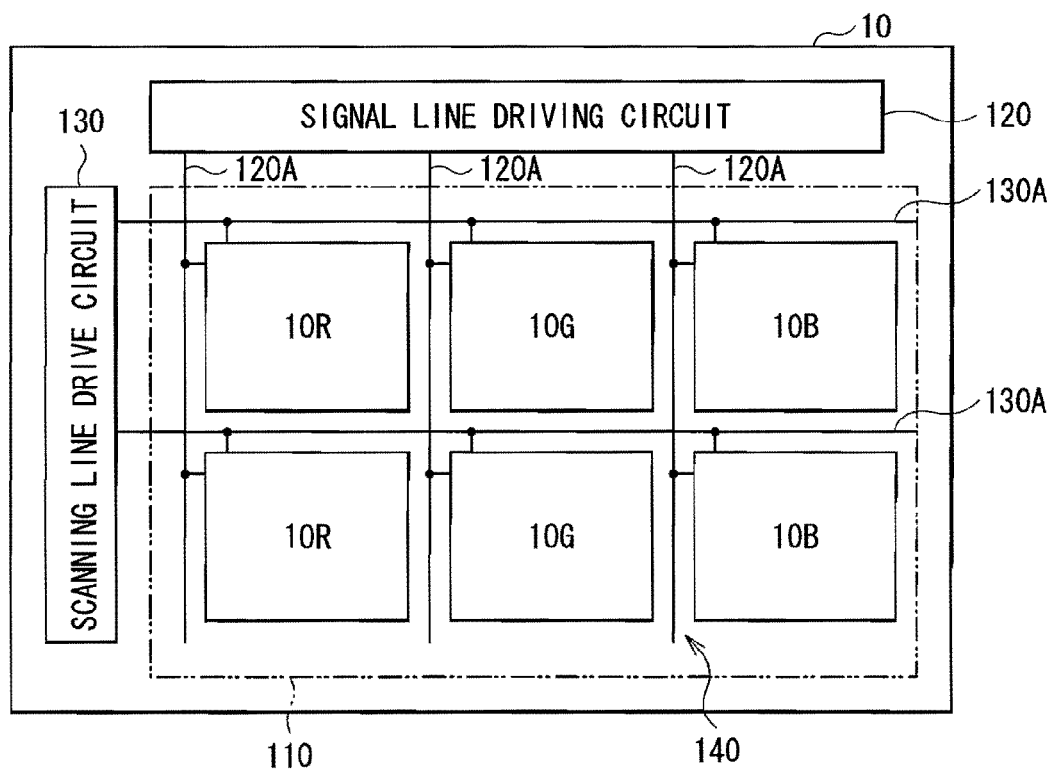
FIG. 9 is a plan view illustrating a configuration of a drive circuit of a display unit in the module illustrated in FIG. 8.

In the drive-side substrate 10, for example, as illustrated in FIG. 9, a display region 110 and the signal line driving circuit 120 and the scanning line drive circuit 130 as a driver for displaying a video are formed. In the display region 110, a pixel drive circuit 140 is formed. In the display region 110, the organic EL devices 10R, 10G, and 10B are arranged in a matrix state as a whole.

Figure 10:
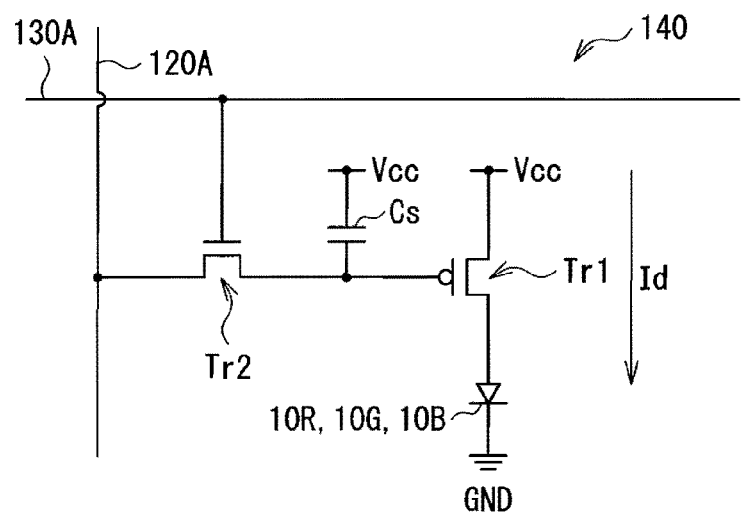
FIG. 10 is an equivalent circuit diagram illustrating an example of the pixel drive circuit illustrated in FIG. 9.

As illustrated in FIG. 10, the pixel drive circuit 140 is formed in a layer lower than the first electrode 13. The pixel drive circuit 140 has a drive transistor Tr1, a writing transistor Tr2, and a capacitor (retentive capacity) Cs between the drive transistor Tr1 and the writing transistor Tr2. Further, the pixel drive circuit 140 has the organic EL device 10R (or 10G, 10B) serially connected to the drive transistor Tr1 between a first power line (Vcc) and a second power line (GND). That is, the pixel drive circuit 140 is an active drive circuit. The drive transistor Tr1 and the writing transistor Tr2 are composed of a general thin film transistor (TFT). The structure thereof is not particularly limited, and may be, for example, inversely staggered structure (so-called bottom gate type) or staggered structure (top gate type).

In the pixel drive circuit 140, a plurality of signal lines 120A are arranged in the column direction, and a plurality of scanning lines 130A are arranged in the row direction. Each cross section between each signal line 120A and each scanning line 130A corresponds to one of the organic EL devices 10R, 10G, and 10B (sub pixel). Each signal line 120A is connected to the signal line drive circuit 120. An image signal is supplied to a source electrode of the writing transistor Tr2 from the signal line drive circuit 120 through the signal line 120A. Each scanning line 130A is connected to the scanning line drive circuit 130. A scanning signal is sequentially supplied from the scanning line drive circuit 130 to a gate electrode of the writing transistor Tr2 through the scanning line 130A.

First Application Example

Figure 11:
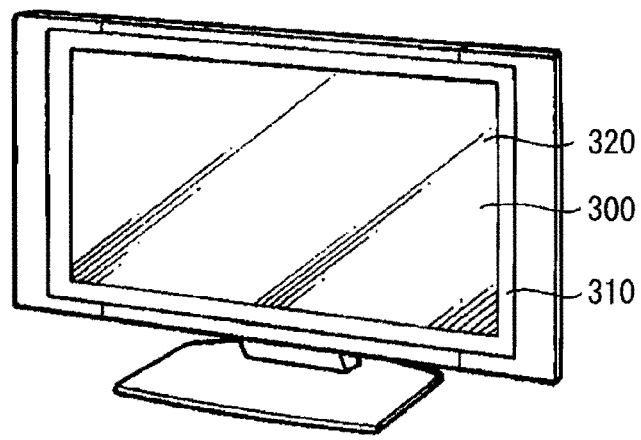
FIG. 11 is a perspective view illustrating an appearance of a first application example of the display unit of the embodiment.

FIG. 11 illustrates an appearance of a television device to which the display unit 1 of the foregoing embodiment and the like is applied. The television device has, for example, a picture display screen section 300 including a front panel 310 and a filter glass 320.

Second Application Example

Figure 12A:
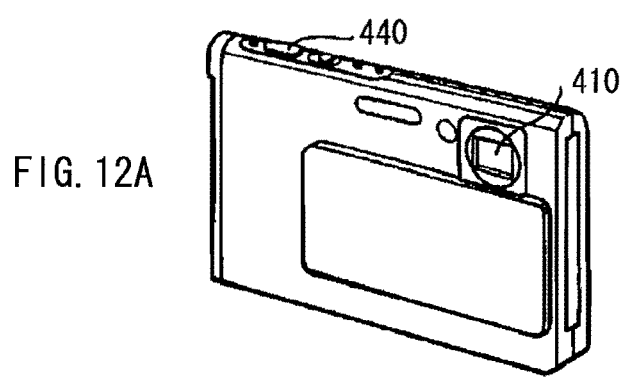
FIGS. 12A and 12B are perspective views illustrating an appearance of a second application example of the display unit of the embodiment.
Figure 12B:
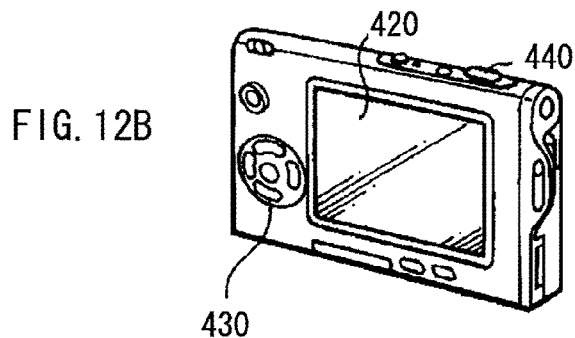

FIGS. 12A and 12B illustrate an appearance of a digital still camera to which the display unit 1 of the foregoing embodiment and the like is applied. The digital still camera has, for example, a light emitting section for a flash 410, a display section 420, a menu switch 430, and a shutter button 440.

Third Application Example

Figure 13:
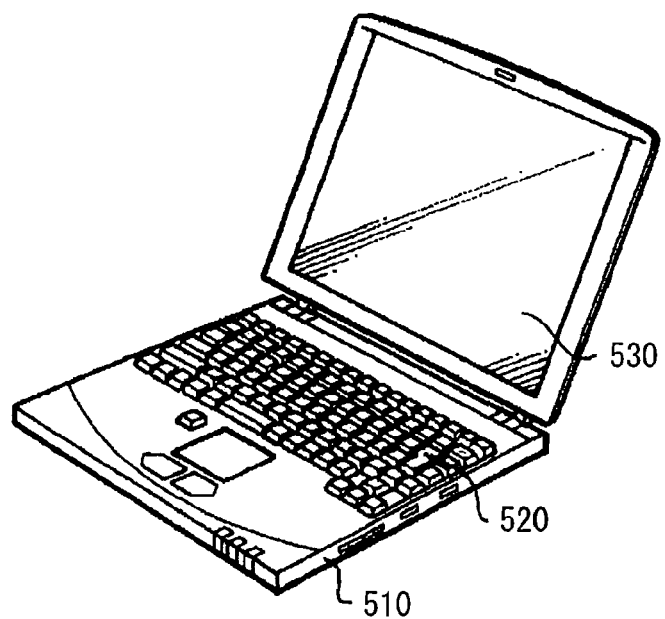
FIG. 13 is a perspective view illustrating an appearance of a third application example of the display unit of the embodiment.

FIG. 13 illustrates an appearance of a notebook personal computer to which the display unit 1 of the foregoing embodiment and the like is applied. The notebook personal computer has, for example, a main body 510, a keyboard 520 for operation of inputting characters and the like, and a display section 530 for displaying an image.

Fourth Application Example

Figure 14:
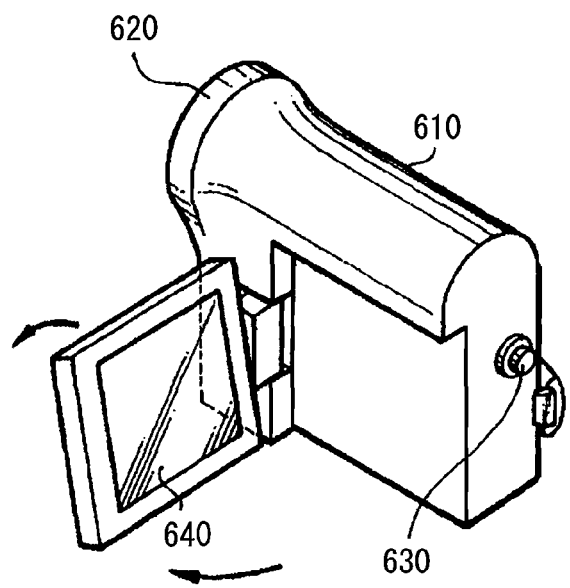
FIG. 14 is a perspective view illustrating an appearance of a fourth application example of the display unit of the embodiment.
Figure 15:
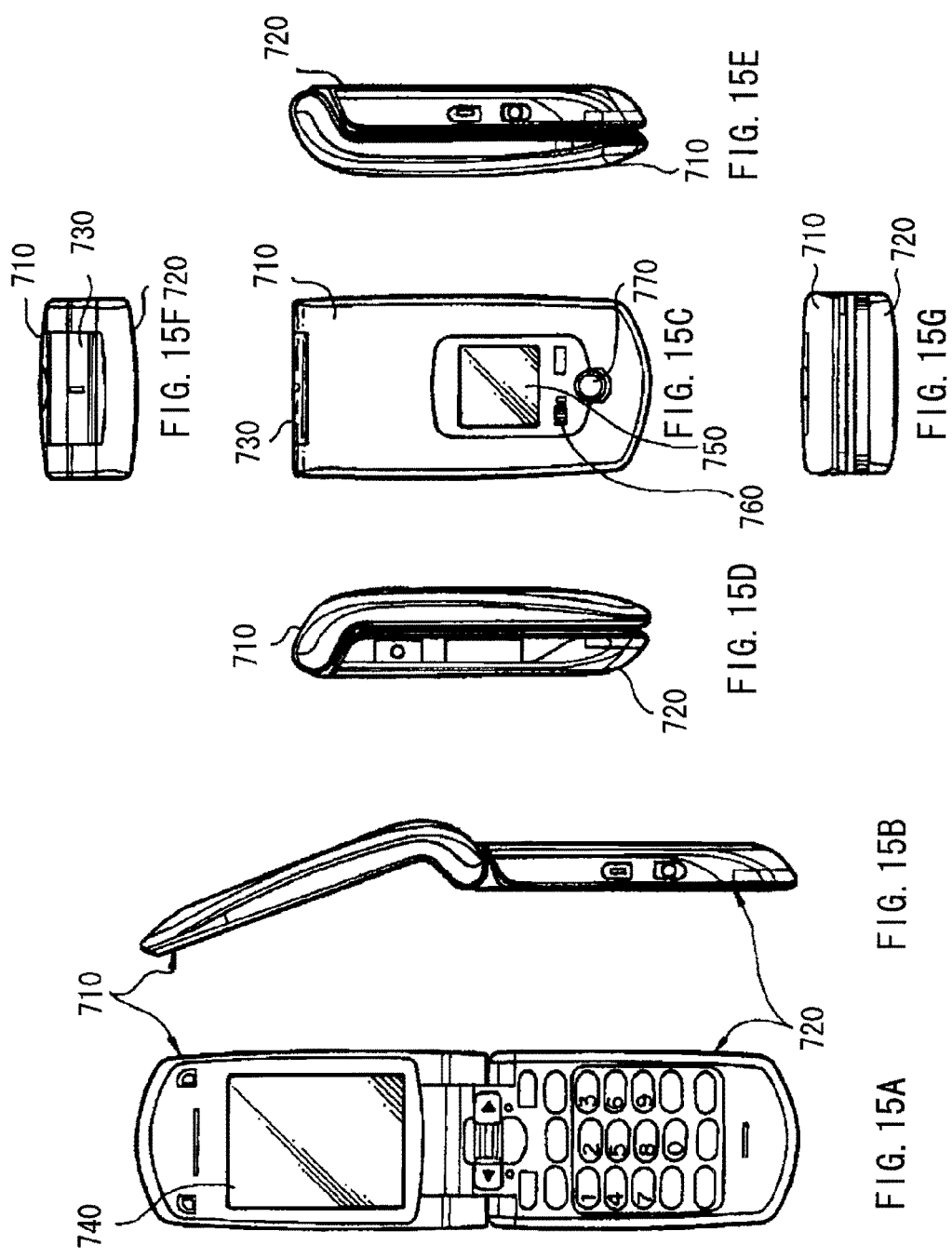
FIGS. 15A to 15G are perspective views illustrating an appearance of a fifth application example of the display unit of the embodiment.
Figure 16:
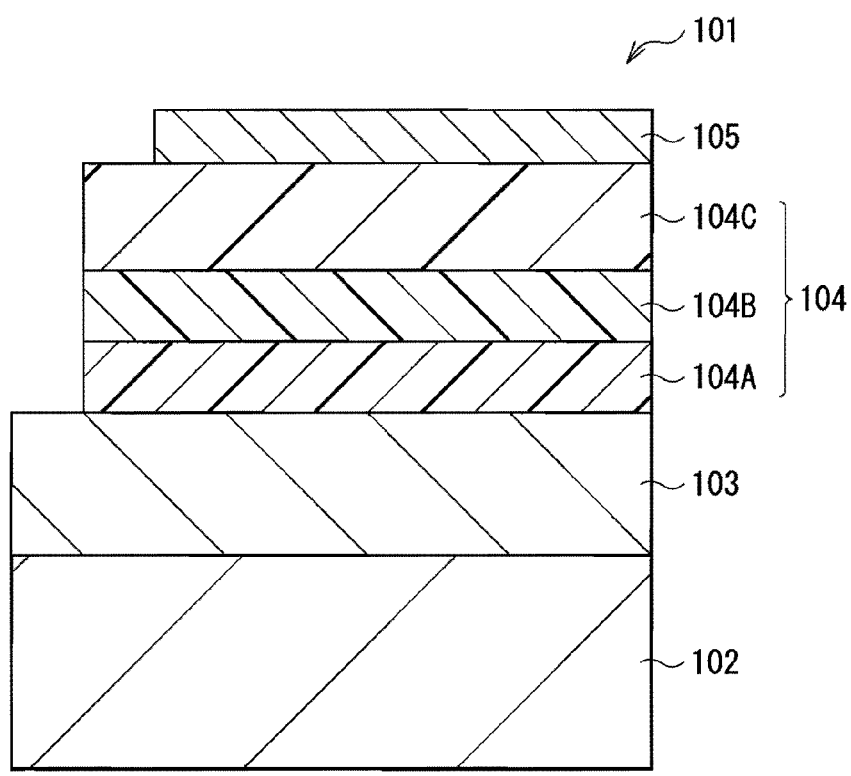
FIG. 16 is a cross sectional view for explaining a structure of an existing organic electroluminescence device.

FIG. 14 illustrates an appearance of a video camera to which the display unit 1 of the foregoing embodiment and the like is applied. The video camera has, for example, a main body 610, a lens for capturing an object 620 provided on the front side face of the main body 610, a start/stop switch in capturing 630, and a display section 640.

Fifth Application Example

FIGS. 15A to 15G illustrate an appearance of a mobile phone to which the display unit 1 of the foregoing embodiment and the like is applied. In the mobile phone, for example, an upper package 710 and a lower package 720 are jointed by a joint section (hinge section) 730. The mobile phone has a display 740, a sub-display 750, a picture light 760, and a camera 770.

While the invention has been described with reference to the embodiment, the examples, and the application examples, the invention is not limited to the foregoing embodiment and the like, and various modifications may be made.

For example, in the foregoing embodiment and the like, the description has been given of the case that the first anode layer 41A is composed of aluminum simple substance. However, if the first anode layer 41A has a lower resistance than that of the second anode layer 41C, an alloy containing aluminum as a main component may be used as the first anode layer 41A.

Further, in the foregoing embodiment and the like, the description has been mainly given of the case that the hole injection layer 51, the hole transport layer 52, the light emitting layer 53, and the electron transport layer 54 composing the organic layer 50 are respectively formed from a single layer. However, each layer may be formed from a plurality of layers.

Further, the material, the thickness, the film-forming method, the film-forming conditions and the like of each layer are not limited to those described in the foregoing embodiment and the like, but other material, other thickness, other film-forming method, and other film-forming conditions may be adopted.

In addition, in the foregoing embodiment and the like, the description has been given of the top emission type organic electroluminescence device. However, the invention may be applied to a bottom emission type organic electroluminescence device. In this case, a substrate is made of a transparent material, and an anode, an organic layer, and a cathode are layered in this order on the transparent substrate in the same manner as that of the foregoing embodiment. However, in this case, as a reflecting electrode, the cathode has a laminated structure as in the anode described in the foregoing embodiment and the anode is a transparent electrode. Specifically, in the cathode in this case, for example, a second cathode layer (layer corresponding to the second anode layer 41C) and a first cathode layer (layer corresponding to the first anode layer 41A) are layered sequentially from the organic layer side. Otherwise, the first cathode layer (layer corresponding to the first anode layer 41A) and the second cathode layer (layer corresponding to the second anode layer 41C) are layered sequentially from the organic layer side. In addition, according to needs, a protective layer (middle layer) is formed between the first cathode layer and the second cathode layer. In the bottom emission type organic electroluminescence device having the foregoing structure, effect similar to that of the foregoing embodiment is obtainable.

In addition, in the foregoing embodiment and the like, the description has been given of the case that the three layers (the red light emitting layer, the green light emitting layer, and the blue light emitting layer) are included as the light emitting layer 53 of the organic layer 50. However, the structure of the light emitting layer for emitting white light is not limited thereto. That is, a structure in which two light emitting layers of two colors complementary to each other such as a combination of an orange light emitting layer and a blue light emitting layer and a combination of a blue-green light emitting layer and a red light emitting layer may be adopted. Further, in the foregoing embodiment, the description has been given of the case that the three layers are layered in the thickness direction. However, each color light emitting layer may be separately formed by coating for every pixel correspondingly to each pixel of R, G, and B.

In addition, in the foregoing embodiment and the like, the description has been given of the active matrix type display unit. However, the invention may be applied to a passive type display unit.

The present application contains subject matter related to that disclosed in Japanese Priority Patent Application JP 2009-012180 filed in the Japan Patent Office on Jan. 22, 2009 and Japanese Priority Patent Application JP 2009-042084 filed in the Japan Patent Office on Feb. 25, 2009, the entire contents of which are hereby incorporated by references.

It should be understood by those skilled in the art that various modifications, combinations, sub-combinations and alternations may occur depending on design requirements and other factors insofar as they are within the scope of the appended claims or the equivalents thereof.

What is claimed is:

1. An organic electroluminescence device comprising:
an anode;
a cathode; and
an organic layer including a light emitting layer in-between the anode and the cathode,
wherein,
the anode has a laminated structure including (a) a first layer composed of aluminum (Al) or an alloy containing aluminum as a main component and (b) a second layer that is provided between the first layer and the organic layer and is composed of an alloy containing aluminum as a main component, and
a resistance of the first layer is lower than a resistance of the second layer.

2. The organic electroluminescence device according to claim 1, wherein the anode has a protective layer between the first layer and the second layer.

3. The organic electroluminescence device according to claim 2, wherein the protective layer is composed of molybdenum (Mo), titanium (Ti), chromium (Cr), nickel (Ni), or an alloy containing these elements as a main component.

4. The organic electroluminescence device according to claim 1, wherein the second layer has higher heat stability and higher hillock resistance than those of the first layer.

5. The organic electroluminescence device according to claim 1, wherein the alloy of the second layer further comprises an accessory component, the accessory component being at least one element having a relatively smaller work function than that of the main component of the alloy.

6. The organic electroluminescence device according to claim 5, wherein the accessory component of the alloy of the second layer contains at least one element of neodymium (Nd), tantalum (Ta), titanium (Ti), nickel (Ni), tungsten (W), and silicon (Si).

7. The organic electroluminescence device according to claim 1, wherein the anode, the organic layer, and the cathode are sequentially layered upward, and
the cathode is made of a material having transmissive characteristics to light emitted from the light emitting layer.

8. The organic electroluminescence device according to claim 1, wherein a layer contacted with the anode in the organic layer contains a compound shown in the following Formula 1:

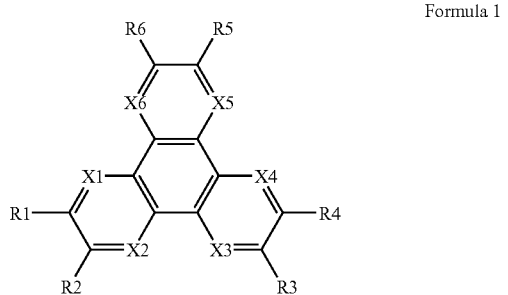

Formula 1 where each of R1 to R6 represent hydrogen, halogen, a hydroxyl group, an amino group, an arylamino group, a substituent or an unsubstituted carbonyl group with the carbon number of 20 or less, a substituent or an unsubstituted carbonyl ester group with the carbon number of 20 or less, a substituent or an unsubstituted alkyl group with the carbon number of 20 or less, a substituent or an unsubstituted alkenyl group with the carbon number of 20 or less, a substituent or an unsubstituted alkoxyl group with the carbon number of 20 or less, a substituent or an unsubstituted aryl group with the carbon number of 30 or less, a substituent or an unsubstituted heterocyclic group with the carbon number of 30 or less, or a substituent group selected from the group consisting of a cyano group, a nitro group, an isocyano group, and a silyl group; adjacent Rm (m: 1 to 6) is allowed to be bonded to each other through an annular structure; and X1 to X6 respectively and independently represent a carbon atom or a nitrogen atom.

9. A display unit comprising:
an organic electroluminescence device having an organic layer including a light emitting layer between an anode and a cathode,
wherein,
the anode has a laminated structure includes (a) a first layer composed of aluminum (Al) or an alloy containing aluminum and (b) a second layer that is provided between the first layer and the organic layer and is composed of an alloy containing aluminum, and
a resistance of the first layer is lower than a resistance of the second layer.

10. The display unit according to claim 9, wherein the anode has a protective layer between the first layer and the second layer.

11. The display unit according to claim 10, wherein the protective layer is composed of molybdenum (Mo), titanium (Ti), chromium (Cr), nickel (Ni), or an alloy containing these elements as a main component.

12. The display unit according to claim 9, wherein the second layer has higher heat stability and higher hillock resistance than those of the first layer.

13. The display unit according to claim 9, wherein the alloy of the second layer further comprises an accessory component, the accessory component being at least one element having a relatively smaller work function than that of the main component of the alloy.

14. The display unit according to claim 13, wherein the accessory component of the alloy of the second layer contains at least one element of neodymium (Nd), tantalum (Ta), titanium (Ti), nickel (Ni), tungsten (W), and silicon (Si).

15. The display unit according to claim 9, wherein the anode, the organic layer, and the cathode are sequentially layered upward, and
the cathode is made of a material having transmissive characteristics to light emitted from the light emitting layer.

16. The display unit according to claim 9, wherein a layer contacted with the anode in the organic layer contains a compound shown in the following Formula 1:

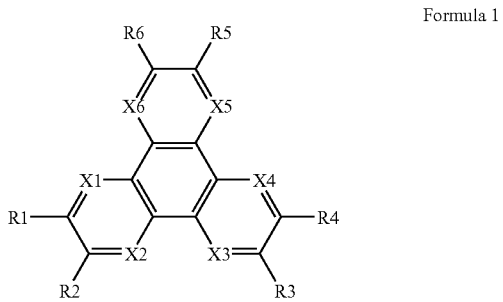

Formula 1 where each of R1 to R6 represent hydrogen, halogen, a hydroxyl group, an amino group, an arylamino group, a substituent or an unsubstituted carbonyl group with the carbon number of 20 or less, a substituent or an unsubstituted carbonyl ester group with the carbon number of 20 or less, a substituent or an unsubstituted alkyl group with the carbon number of 20 or less, a substituent or an unsubstituted alkenyl group with the carbon number of 20 or less, a substituent or an unsubstituted alkoxyl group with the carbon number of 20 or less, a substituent or an unsubstituted aryl group with the carbon number of 30 or less, a substituent or an unsubstituted heterocyclic group with the carbon number of 30 or less, or a substituent group selected from the group consisting of a cyano group, a nitro group, an isocyano group, and a silyl group; adjacent Rm (m: 1 to 6) is allowed to be bonded to each other through an annular structure; and X1 to X6 respectively and independently represent a carbon atom or a nitrogen atom.

* * * * *